United States Patent
Disney

[11] Patent Number: 5,910,668
[45] Date of Patent: Jun. 8, 1999

[54] METHOD OF MAKING A INSULATED GATE BIPOLAR TRANSISTOR WITH HIGH-ENERGY P+ IMPLANT AND SILICON-ETCH CONTACT

[75] Inventor: Donald Ray Disney, Kokomo, Ind.

[73] Assignee: Delco Electronics Corporation, Kokomo, Ind.

[21] Appl. No.: 08/909,436

[22] Filed: Jun. 9, 1997

Related U.S. Application Data

[62] Division of application No. 08/526,427, Sep. 11, 1995, Pat. No. 5,843,796.

[51] Int. Cl.$^6$ .............................. H01L 29/76; H01L 29/74
[52] U.S. Cl. ......................... 257/329; 257/139; 257/330
[58] Field of Search .................................... 257/133, 137, 257/328, 329, 330, 132, 139, 341

[56] References Cited

U.S. PATENT DOCUMENTS

| | | | |
|---|---|---|---|
| 4,853,345 | 8/1989 | Himelick | 437/41 |
| 4,879,254 | 11/1989 | Tsizilo et al. | 437/41 |
| 4,960,723 | 10/1990 | Davies | 437/41 |
| 5,079,602 | 1/1992 | Harada | 357/23.4 |
| 5,155,052 | 10/1992 | Davies | 437/40 |
| 5,178,370 | 1/1993 | Clark et al. | 257/212 |
| 5,179,032 | 1/1993 | Quigg | 437/41 |
| 5,262,336 | 11/1993 | Pike, Jr. et al. | 437/31 |
| 5,366,914 | 11/1994 | Takahashi et al. | 437/41 |
| 5,451,531 | 9/1995 | Yamaguchi et al. | 437/31 |
| 5,731,604 | 3/1998 | Kinzer | 257/329 |

OTHER PUBLICATIONS

Disney, D.R., and Plummer, J.D.m :SOI LIGBT Devices with a Dual P–Well Implant for Improved Latching Characteristics, 1993.

Proceeding from the Fifth INternational Synopossium on Power Semi–conductor Devices and IC's, pp. 254–258 The Vertical IGBT With an Implanted Buried Layer, Eranen and Blomberg.

*Primary Examiner*—Tom Thomas
*Assistant Examiner*—Ori Nadav
*Attorney, Agent, or Firm*—Jimmy L. Funke

[57] ABSTRACT

An improved insulated gate bipolar transistor (IGBT) device structure and a method for fabricating such a device. This structure uses self-aligned and substantially undiffused successive N+ and P+ implants. The P+ implant is at high energy, which forms a subsurface P+ region below the entire bottom of an N+ "source" region of the IGBT. This low resistivity region suppresses thyristor latch-up when contacted via a surface trench. Self-aligned techniques provide method and product improvements.

14 Claims, 2 Drawing Sheets

METHOD OF MAKING A INSULATED GATE BIPOLAR TRANSISTOR WITH HIGH-ENERGY P+ IMPLANT AND SILICON-ETCH CONTACT

This is a division of application Ser. No. 08/526,427 filed on Sep. 11, 1995 now U.S. Pat. No. 5,843,796.

BACKGROUND OF THE INVENTION

1. Field of the Invention

This invention relates to a semiconductor switching device having multiple PN junctions, an insulated gate, along with a distinctive doping geometry and surface geometry. This invention also relates to a method of making such a device. More specifically this invention relates to an insulated gate bipolar transistor (IGBT) having a unique subsurface enhancement doping, a surface recess that accesses the subsurface doping, and a cathode contact in the recess.

2. Description of the Prior Art

An insulated gate bipolar transistor (IGBT) is an attractive semiconductor switching device because it provides relatively low forward conduction resistance. On the other hand, we have recognized that the current typical structure for an IGBT has a disadvantage in that it inherently contains a parasitic thyristor structure. For example, if the IGBT works by way of a PNP transistor, it will inherently have a parasitic NPN transistor that is cross coupled to the PNP transistor, to form a parasitic PNPN thyristor structure.

In the current typical IGBT of the PNP type, the PNP bipolar transistor is formed by a P+ anode layer, on which is disposed an N-type drift region. The doping in the n-type drift region varies over its thickness. A P-well is disposed in the N-type drift region, to complete the PNP structure. When the current typical IGBT is turned "on", conduction in the forward state utilizes the bipolar action of the above-mentioned PNP transistor to achieve a low forward voltage drop. During forward conduction, holes are injected from the P+ anode layer into the N-type drift region. These holes are collected by the P-well in the drift region.

In such an IGBT construction, an N-type annular "source" region is concentrically disposed within the P-well. A spacing between the outer peripheries of the "source" region and the P-well provides a circumferential "channel" region on the surface of the P-well inside its outer edge. An insulated gate control electrode is disposed on the "channel" region. A cathode contact for the IGBT makes a low resistance connection to both the annular N-type "source" region and the P-well portion exposed in the center of the annular N-type "source" region. This type of contact is also referred to herein as a "shorted" contact.

Voltage applied to the insulated gate electrode creates a low resistance electric path across the "channel" region of the P-well. This creates a low electrical resistance path between the N-type "source" region and the N-type drift region. This allows electron current to flow between them. This flow of electron current serves as a source of "base" current to the PNP transistor of the IGBT. Flow of "base" current to the PNP transistor, of course, controls flow of hole current between the P-type anode layer and the P-well. In summary, the flow of "base" current, and also the flow of hole current between anode and cathode, is controlled by the application of voltage to the insulated gate electrode over the "channel" region. Hence, turn-on and turn-off of the IGBT is controlled by application of voltage to the insulated gate electrode.

In the current, typical IGBT, the P+ anode region, the N-type drift region and the P-well form the PNP structure. Unfortunately, the N-type "source" region, P-well, and N-type drift region form a parasitic (unwanted) NPN transistor that is cross coupled with the PNP transistor. This forms the parasitic PNPN thyristor structure. The parasitic NPN transistor structure interferes with turn-off of the IGBT. The reason for this is that if the parasitic NPN transistor is turned-on, it is in parallel with the "channel" region and thus, provides an alternate source of electron current. As indicated above, the electron current through the "channel" region is used to control current through the IGBT. The parasitic NPN transistor subverts this control by obviating the need for the channel region as a source of electron current.

The annular N-type "source" region forms an annular pinch resistance area in the P-well. It is located between the bottom of the annular N-type region and the adjacent bottom portions of the P-well. The pinch resistance affects hole current entering the sides and outer bottom portions of the P-well. Hole current collected at those side and bottom portions of the P-well region must flow through the pinch resistance to get to the surface of the P-well in the center of the N-type annulus, where the cathode terminal is located.

The flow of hole current through the pinch resistance causes a voltage drop from the cathode contact to the outer portions of the P-well. The voltage drop across the pinch resistance can turn-on the inherent PNPN thyristor referred to above. The PNPN thyristor is turned "on" when there is a voltage drop exceeding about 0.7 volts between the outer periphery of the P-well and the annular N-type "source" region. The reason for this is that the annular N-type region is shorted to the central part of the P-well. Hence, they are at about the same potential. It is to be noted that the P-well/"source" region diode (i.e., PN junction) acts as an emitter/base junction for the parasitic NPN transistor mentioned above. If the voltage drop between the outer and inner periphery of the P-well exceeds about 0.7 volts, this emitter/base junction becomes forward biased and the parasitic NPN transistor turns "on".

As mentioned, the parasitic NPN transistor is cross coupled with the PNP transistor. Once turned "on", the NPN transistor provides a source of base current for the PNP transistor in parallel with that supplied by the insulated gate electrode. Unfortunately, the NPN source of current is not controlled by the gate electrode. This type of condition is referred to as latch up. When this occurs, gate control is lost and IGBT device damage is likely to occur. Therefore, it is of utmost importance to prevent latch-up from occurring during the normal operation of an IGBT.

In order to make an IGBT immune to latch-up, it is necessary to minimize the IR drop across the pinched portion of the P-well. This has been provided in the prior art by more highly doping the P-well. The doping is controlled by the P-well ion implant and drive-in. However, the amount of dopant, i.e., dose, of the P-well ion implant also controls the threshold voltage of the gate control electrode for the IGBT. Because reasonably low threshold voltages are generally required, the dose of the P-well cannot simply be increased to improve the immunity to latch-up.

To suppress latch-up, it is important to provide a low electrical resistance path between the pinch resistance area of the P-well and the cathode. This would include providing reduced contact resistance between the metallization forming the cathode contact and the P-well. Both aspects have been addressed in the past by providing a P+ deep diffusion, or "sinker" diffusion in the center of the annular N-type "source" region. This is shown in FIG. 1, which will hereinafter be more fully described.

The "sinker" diffusion, provides a good ohmic contact to the cathode metallization and a low resistance path from the metallization to the backside of the pinched P-well region. The "sinker" diffusion can also increase the amount of dopant in the pinched P-well region, which lowers its resistance.

One of the more important problems with the P+ sinker is that its alignment to the edge of the polycrystalline silicon gate is critical, and so is control of the diffusion process. It is important to recognize that when a dopant diffuses vertically, it also diffuses horizontally a substantially similar amount. If one tries to diffuse too deeply, a lateral diffusion problem can result. The P+ sinker can diffuse laterally into the "channel" region, and thus increase the threshold voltage of the IGBT. If the P+ sinker diffusion does not go deeply enough, it may not lower pinch resistance much or at all. Diffusion control and masking registration are critical here.

A further drawback, to the "sinker" diffusion solution for suppressing thyristor action, is that the N+ diffusion must be must be masked at the center of the cell to produce the N-type "source" diffusion annulus. The center of the cell has to be masked again to produce the cathode metallization, which contacts both the P+ sinker and the n-type annular "source" region but not the outwardly concentric gate electrode. Accordingly, the masks for the N-type annular "source" region limit the minimum size of the emitter opening. The reason is that it must have sufficient overlap with the source contact, including allowances for mis-registration between masks and critical-dimension variation. In order to allow for annulus contact tolerances, a wider n-type annulus has to be used. Providing the wider annulus is objectionable because it increases the overall size of the device, which is objectionable from several standpoints.

OBJECTS AND SUMMARY OF THE INVENTION

A principal object of this invention is to provide an improved insulated gate switching transistor, especially an improved insulated gate bipolar transistor (IGBT).

Another object of this invention is to provide an improved method of making power switching transistors, especially an IGBT having suppressed latch up tendencies.

These and other objects of the invention are attained in an improved IGBT structure that has a deep P+ ion implantation below the N-type "source" diffusion and, an etched surface recess that accesses the deep P+ ion implant. In a more preferred embodiment, the recess is given an enhancement ion implant to prevent punch-through of the portion of the P-well beneath the deep P+ ion implant.

In the improved method of this invention, both the N-type source ion implant and the deep P+ ion implant are self-aligned with a concentric silicon gate electrode and both are solid disc-like regions. No separate central masking operation is necessary to form either of these regions. In addition, no central deep P-type diffusion is used. Hence, a wider N-type "source" annulus is not needed to accommodate it. Our deep P+ ion implant is preferably activated at low temperature, so as to minimize any up-diffusion that would increase threshold voltage of the polycrystalline silicon gate electrode. A polycrystalline silicon thickness of about 0.75–1 micrometers is adequate to mask underlying silicon from even the deep P+ ion implant.

DESCRIPTION OF THE PREFERRED EMBODIMENTS

As indicated above this invention provides an improved structure for an insulated gate bipolar transistor (IGBT) and a method of making that improved structure. The structure involves a disk-like N-type "source" region as formed, as opposed to an annular one. It also involves a deep P+ ion implant that is also disk-like and registered with the disk-like N-type "source" ion implant. The structure is also distinctive in that there is a surface recess down through the center of the N-type "source" region disk into the deep P+ disk-like region. In a preferred embodiment, the bottom of the recess is given a P+ enhancement ion implant to raise punch-through voltage in this area of the P-well, because it may be quite thin in some instances. Still further, polycrystalline silicon gate thickness is increased to about 0.75–1 micrometer so that it can mask the deep P+ ion implant.

Figure 1:
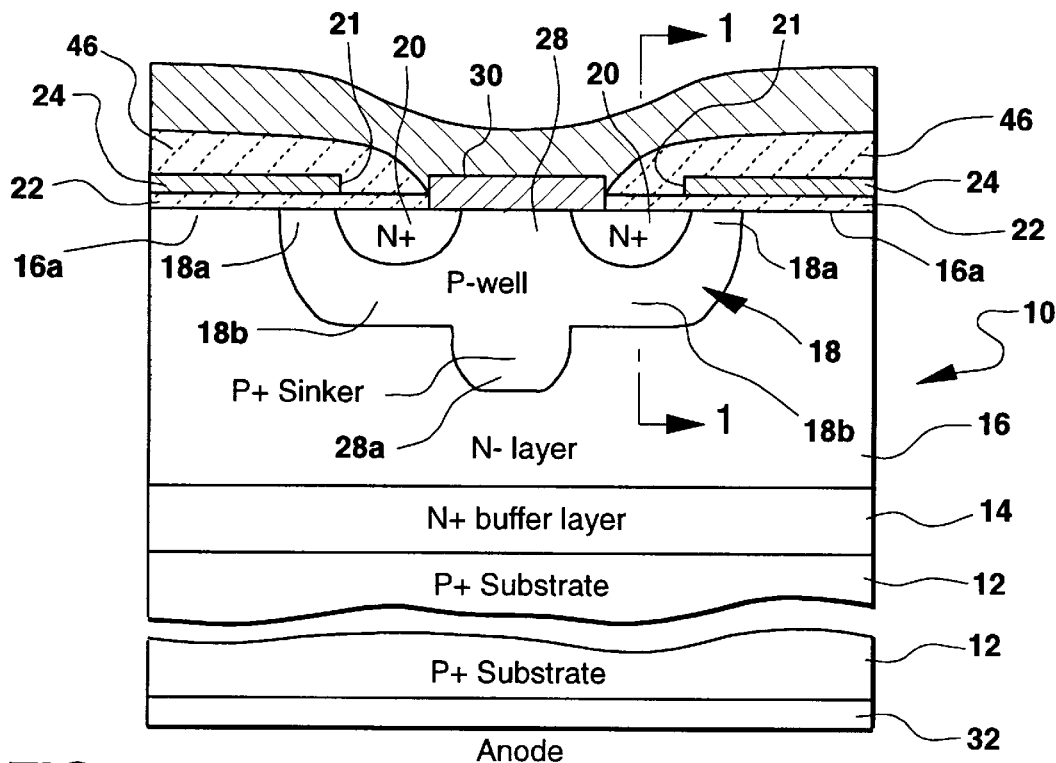
FIG. 1 is a cross sectional view of a prior art insulated gate bipolar transistor (IGBT).

For background and comparison with this invention, reference is now made to FIG. 1, which illustrates a typical prior art IGBT that has a "sinker" diffusion for suppression of parasitic thyristor action. The IGBT of FIG. 1 is made of a monocrystalline silicon chip 10, that forms a P+ substrate layer 12 for the device. Chip 10 could be about 6 mm by 6 mm on its sides and a thickness of about 425 micrometer. The base layer 12, referred to as a P+ substrate layer, has a conductivity or doping level of about 0.08 to 0.002 ohm centimeter and is about 500 to 600 micrometer thick. A monocrystalline silicon N+ buffer layer 14 is on P+ substrate layer 12. N+ buffer layer 14 is about 10 to 20 micrometer thick and has a conductivity or doping level of about 0.05 to 0.2 ohm-centimeter. A monocrystalline silicon N-layer 16 is disposed on the N+ buffer layer 14. The monocrystalline silicon N-layer has a thickness of about 50 to 100 micrometer and a conductivity or doping level of about 15 to 100 ohm-centimeter. Together layers 14 and 16 comprise a drift region for the resultant insulated gate bipolar transistor which FIG. 1 represents. The monocrystalline N-layers 14 and 16 can be epitaxial layers. Epitaxial deposition might be done in a single deposition, where doping level is changed.

An island like P-type region 18 is inset to a depth of about 2.0 to 6.0 micrometer in the surface of N-layer 16. The P-type island like region 18 is referred to as a "P-well". The nominal conductivity or doping level of the P-well 18 is about 300 to 600 ohms per square. An annular N+ "source" region 20 is inset in the surface of P-well 18 to a depth of about 0.2 to 1.0 micrometer. The lateral outward periphery of N+ annular "source" region 20 is less than the lateral outward periphery of P-well 18. The inner diameter of the annular "source" region 20 is about *3 micrometer to 15 micrometer, preferably 9 micrometer. Its outer diameter is about 10 micrometer to 20 micrometer, preferably 15 micrometer. The diameter of P-well 18 is about 15 micrometer to 30 micrometer, preferably 22 micrometer. Accordingly, a 1.0–5.0 micrometer wide portion 18a of P-well 18 surrounds the outer periphery of N+ annular "source" region 20. Thus, the surrounding portion 18a of P-well 18 provides a P-type region between the outer periphery of N+ annular region 20 and the upper portions 16a of the N-layer 16. A silicon dioxide layer 22 is on the upper surface of chip 10. Over portion 18a, it has a thickness of about 400–1500 angstroms. It may have other thicknesses in other areas but a variation in thickness is not shown, to better focus on the aspects of the structure that are improved with this invention.

A 0.25–0.6 micrometer thick high conductivity polycrystalline silicon gate electrode layer 24 overlies the silicon dioxide layer 22. The polycrystalline silicon layer 24 thus serves as a gate electrode over the outer periphery 18a of P-well 18. This permits the surface of portion 18a to serve as a "channel" region of an insulated gate field effect transistor formed between N+ annular region 20 and the surrounding portion 16a of N-type layer 16. In this respect the N+ annular region 20 serves as a source region for the insulated gate field effect transistor, and is referred to herein as an N+ "source" region.

A deep P+ region 28 extends down into the P-well 18 through the center opening of N+ "source" region 20. This is the deep P+ diffusion hereinbefore referred to as a "sinker" diffusion. The deep P+ region 28 has a portion 28a that extends below the bottom surface of P-well 18. In the preferred prior art structure, the deep P+ region 28 has some extension (not shown) into the outer portions 18b of P-well 18 that are beneath the N+ annular "source" region 20. N+ annular "source" region 20 reduces the thickness of, i.e., pinches, P-well 18 in portions 18b. This reduction in thickness in the "pinch" region 18b causes a corresponding increase in electrical resistance in portion 18b. Holes collected at the outer periphery of P-well 18 have to pass through this higher electrical resistance region, or "pinch" region, 18b, in order to reach the "sinker" central P+ region 28. In a preferred embodiment, lateral out-diffusion (not shown) from the central deep P+ region 28 tends to approach into the pinch region 18b, hopefully thereby reducing electrical resistance of the pinch region 18b itself, not just in the central portions of P-well 18 electrically in series with it.

A circular disk-like electrode 30 of aluminum alloy or the like contacts the upper surface of both N+ "source" region 20 and deep P+ region 28, as shown. It is referred to as a cathode. An aluminum alloy electrode 32 is disposed on the lower face of the P+ substrate layer 12. It is referred to as an anode. For turn-on of this device an electrical voltage is applied between the anode layer 32 and cathode layer 30. Concurrently, a voltage is applied to gate electrode 24 that is above threshold voltage of the underlying "channel" region. Current is supplied to N-layer 16 through "channel" 18a, turning on the PNP bipolar transistor formed between P+ substrate 12, N-type drift layers 14 and 16, and P-well 18.

As indicated in the preceding Background of the Invention, a number of problems are involved in providing the deep P+, or "sinker" diffusion 28 within the center of N+ annular "source" region 20. The various problems involved in this construction were hereinbefore amply described. To avoid repetition they shall not be described again here.

Figure 2:
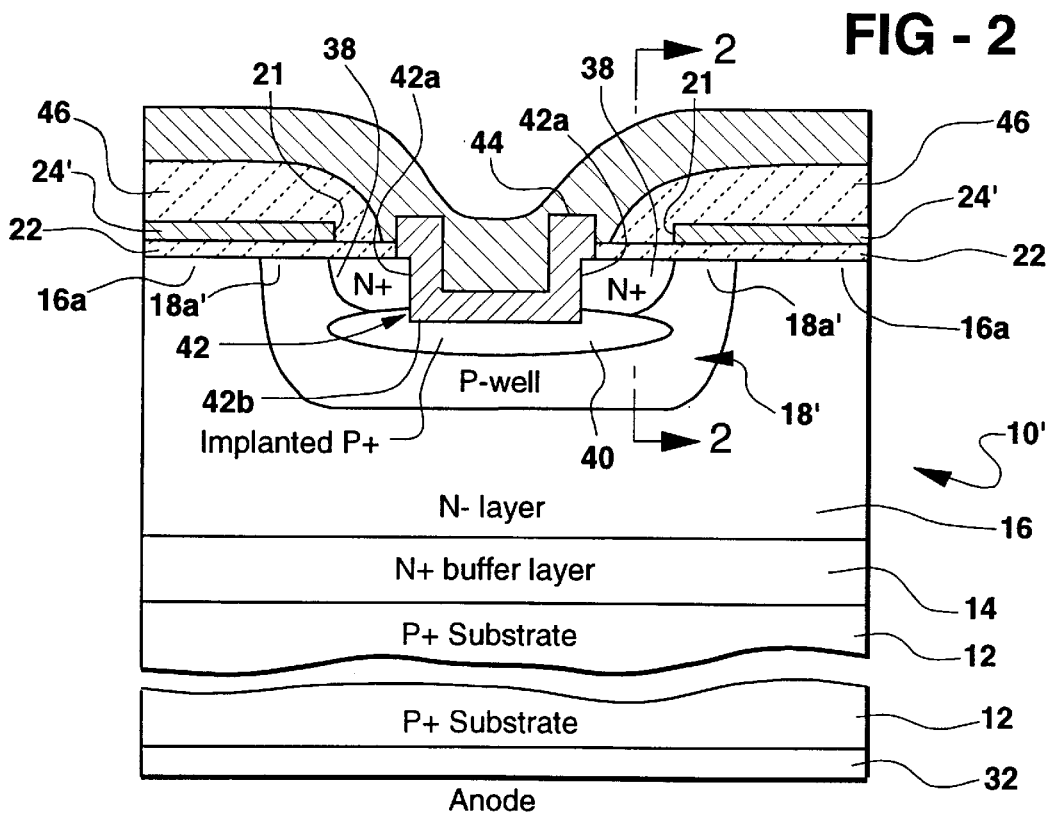
FIG. 2 is a cross sectional view showing an improved insulated gate bipolar transistor (IGBT) made in accordance with this invention.

Reference is now made to FIG. 2, which illustrates an insulated gate bipolar transistor (IGBT) made in accordance with this invention. The IGBT made in accordance with this invention is similar in many respects to the prior art IGBT shown in FIG. 1. Those portions that are the same are given the same reference numerals. For example, our IGBT has an anode terminal 32, a P+ substrate layer 12, an N+ buffer layer 14, and an N-layer 16, along with a P-well 18' that is inset in the N-layer 16. The N-type layers 14 and 16 together comprise a drift region between the P+ substrate layer 12 and the P-well region 18'. The layer and regions can be of the same doping level and thicknesses, or depths, as stated in connection with FIG. 1. As in FIG. 1, the P+ substrate layer 12, the N-type layers 14 and 16, and the P-well 18' of FIG. 2 comprise a PNP transistor. A silicon dioxide layer 22, similar to layer 22 in FIG. 1, is disposed on the upper surface of chip 10'. The lower surface of P+ substrate layer 12 has an aluminum alloy electrode 32 on it that is designated as an anode. Anode 32 serves the same purpose as it does in FIG. 1. It too is the same as anode 32 in FIG. 1.

In FIG. 2, a highly doped polycrystalline silicon gate electrode layer 24' is disposed on the silicon dioxide layer 22. Polycrystalline silicon layer 24' serves all of the same functions as polycrystalline silicon layer 24 in FIG. 1. However, in FIG. 2, polycrystalline silicon gate electrode layer 24' is of increased thickness and serves additional function. In FIG. 2, polycrystalline silicon gate electrode layer 24' preferably has a thickness about 0.75–1.0 micrometers instead of about 0.25–0.6 micrometers as in FIG. 1. The reason for this difference in thickness permits more ready manufacture of the IGBT, and improved IGBT characteristics, as will hereinafter be explained more fully.

In FIG. 2, an N+ "source" region 38 is inset in the surface of P-well 18'. N+ "source" region 38 is annular as shown in FIG. 2 but is referred to by a different reference numeral from N+ annular "source" region 20 of FIG. 1. A different reference numeral is used because N+ "source" region 38 is not annular as-formed, and is formed differently from N+ annular "source" region 20 of FIG. 1. The new technique of formation will be hereinafter described. Under N+ "source" region 38 is a disk-like or plate-like sub-surface, or deep, P+ ion implant 40. The deep P+ ion implant 40 has an outer periphery that is substantially registered with the outer periphery of the N+ "source" ion implant 38. The peak concentration of the subsurface P+ ion implant is preferably at a depth just below the bottom, and perhaps touching the bottom, of N+ "source" region 38. The peak concentration level of the subsurface P+ ion implant region 40 is at a depth of about 0.2 to 0.5 micrometers in this example. This will leave at least about a 1.5 micrometer spacing between the peak concentration level of region 40 and the bottom of the P-well 18'. Leaving such a space is not critical, because if the peak concentration level of region 40 is closer to the bottom of P-well 18', it will help increase a punch-through voltage of the PN junction defining the periphery of P-well 18'.

The inner periphery of the N+ "source" region 38 is defined by upper portions 42a of recess 42 that is etched into the surface of chip 10'. Recess 42 is about 1 to 10 micrometer wide and about 0.2 to 1.0 micrometers deep, preferably about 3 micrometers wide and 0.5 micrometers deep. Recess 42 extends down entirely through N+ "source" region 38 into the disk-like deep P+ ion implant region 40. The bottom 42b of the recess 42 thus exposes a central portion of the width of deep P+ ion implant region 40, and preferably also a middle portion of its thickness where its conductivity, i.e., its peak concentration, is the highest.

It may turn out that recess 42 can reduce the punch-through voltage of the P-well PN junction in the area of the recess bottom 42b. If so, the punch-through voltage can be increased in this area by giving the recess bottom 42b an enhancement ion implant (not shown) performed as hereinafter described.

A metal electrode 44 contacts the bottom 42b of the recess 42 as well as the recess sides, including side portion 42a. Electrode 44 has a lateral upper portion 44a that overlaps onto the adjoining top surface of N+ "source" region 38 and also onto the upper surface of phosphosilicate glass (PSG) layer. Accordingly, electrode 44 directly contacts both the N+ "source" region 38 and the deep P+ ion implanted region 40. Electrode 44 is referred to as a cathode, and is preferably of an the same aluminum alloy and thickness as cathode 30 in FIG. 1. The phosphosilicate glass layer is a blanket layer having windows in it for making electrical contact to underlying parts of the chip. Electrodes 30 and 44 both can be produced and defined by normal and accepted deposition and photolithographic techniques. It is to be understood that if the depth of recess 42 requires a slightly higher thickness to get adequate step coverage, it should be used.

Figure 3:
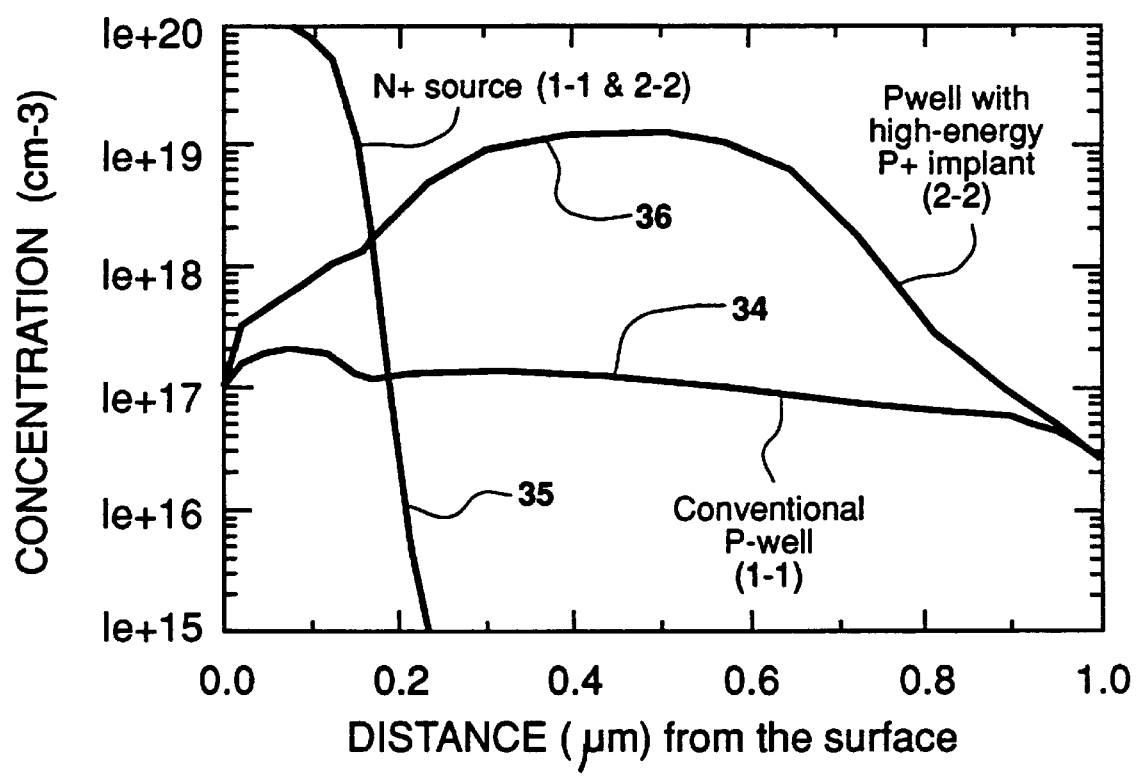
FIG. 3 is a graph comparing respective doping profiles of prior art and the invention along a line 1—1 FIG. 1 and along a line 2—2 of FIG. 2.

Reference is now made to FIG. 3 which is a concentration/distance graph of doping concentration in the FIG. 2 device along a line such as the line 1—1 of FIG. 1. FIG. 3 shows concentration of dopants with increasing distance into chip 10' along the line 2—2 of FIG. 2. The doping concentration through the thickness of a conventional P-well region, including the lateral diffusion from the deep P+ region, is shown along line 34 for comparison. This would be the doping profile, for example, along a similar line in FIG. 1. The doping concentration through the thickness of the N+ "source" region 38 is shown along line 35. Dopant concentration of the P-well in the new IGBT structure (shown in FIG. 2) is shown along line 36. It can be seen that the new IGBT has a much higher dopant concentration in the pinch resistance region 18b. This increase in dopant at a selected depth leads to a marked decrease in pinch resistance, which leads to much greater immunity to latch-up, as described above.

P-well 18 in FIG. 1 and 18' in FIG. 2 is formed without photoresist masking by self-aligned silicon gate techniques, which is a usual manner. In such techniques, a dopant is ion implanted in layer 16a through a window 21 in the polycrystalline silicon gate electrode 24 or 24', and subsequently diffused into the layer. The polycrystalline silicon is a substantially blanket coating with apertures where the P-wells are to be formed. The apertures have a diameter of about 10 micrometer to 20 micrometer, preferably 15 micrometers. The apertures are contemplated here as being circular but in other modifications could be square or elongated rectangles (i.e., strips). The P-well implant is at an energy of about 40 to 80 keV. A moderate dose of boron (about $1\times10^{14}$ atoms per square centimeter) is used to form the P-well 18 of the conventional IGBT, as well as our improved IGBT. The P-well implant is followed by an extended diffusion.

During the drive-in of the ion implant to form P-well 18', the P-type dopant diffuses into the portion of the surface of layer 16 exposed in the window 21 of the polycrystalline silicon layer 24'. Concurrently, the P-type dopant diffuses laterally under the gate electrode layer 24' sufficiently to form a "channel" region 18a' around the entire outer periphery of P-well 18'. This of course is analogous to "channel" region 18a of FIG. 1. Following, formation of P-well 18', the IGBT of FIG. 2 is formed significantly differently from the IGBT of FIG. 1.

In FIG. 2, N+ "source" region 38 does not originally start out as an annulus. Instead, it starts out as a disk-like or plate-like ion implant using window 21 in gate electrode 24' as the mask. Accordingly, like P-well 18', N+ "source" region 38 is self-aligned to window 21 in gate electrode 24'. As-formed, N+ "source" region 38 is a disk or plate-like region of N-type dopant, preferably arsenic, ion implant doping that is registered with the window 21 in gate electrode 24', and is approximately 0.2 to 0.3 micrometers deep. In this example of the invention, N+ "source" region 38 has a diameter of about 8 micrometers to 15 micrometers, preferably about 10 micrometers, as compared to a preferred outer diameter of about 15 micrometers for N+ "source" region 20. To form it, the ion implant energy of about 50–100 keV can be used and a dose of about $5\times10^{15}$ to $1\times10^{16}$, preferably, $8\times10^{15}$, atoms per square centimeter.

Preferably, N+ "source" region 38 is not heated to diffuse the arsenic very much, if at all. On the other hand, it is recognized that some heating is necessary to move the arsenic atoms from interstitial positions in the monocrystalline silicon lattice of chip 10' to substitutional lattice positions. This latter heating is referred to as activation instead of diffusion, because it produces no significant migration of the arsenic atoms along or through the silicon crystal lattice. Activation of the arsenic atoms in the N+ "source" region 38 can be deferred to a later point in the process if desired. In fact, I prefer it.

Next, the upper surface of chip 10' is given a blanket P+ ion implant at more than the usual ion implant energy. An energy of about 100–150 keV can be used. This is a significantly higher energy level because it implants the P+ dopant at a depth recognizably below the bottom of the N+ region 38. Boron can be the P+ dopant in this step.

The 0.75–1.0 micrometer thick polycrystalline silicon gate layer 24' masks this ion implant so that the P+ atoms only enter chip 10' through window 21 in the gate electrode layer 24'. The dosage of the subsurface P+ ion implant is preferably about $1\times10^{14}$–$1\times10^{16}$ atoms per cubic centimeter. This ion implant forms a subsurface disk-like or plate-like region 40 below the lower surface of disk or plate-like N+ region 38. It has an outer periphery that is registered with N+ region 38, when viewed from above. I recognize that in ion implantation there may be a Gaussian distribution of planes of different doping concentration through the thickness of region 40. However, the group of planes having the highest dopant concentration define a thickness of a disk or plate, with the highest concentration planes being in the middle of the thickness.

The recess 42 is formed in the center of N+ "source" region 38 after the subsurface P+ region 40 is formed. Recess 42 can be formed separately, using its own masking step, as indicated in FIG. 2. On the other hand, recess 42 can also be formed in another way. For example, it can be formed during the same masking in which a contact window is etched through an overlying layer of phosphosilicate glass (PSG) 46. The PSG layer 46 is a blanket layer applied to the surface of chip 10' prior to metallization, to smooth the surface out for metallization. If the PSG contact mask is to be used to etch recess 40, a mask is saved. This reduces cost and increases yields. Accordingly, it is preferred.

In using the contact mask approach to etch recess 42, upper surface of chip 10' is given a blanket coating of phosphosilicate glass 46 in the usual manner. The usual manner of application requires a densification heating step before etching contact windows through the PSG.

It should be mentioned that the densification of the phosphosilicate glass (PSG) 46 is a relatively short, low temperature anneal. Before etching, the PSG is densified by annealing under the usual conditions. By way of example, it can be densified by heating for about 10 to 60 minutes at a temperature of about 900° C. to 1000° C. Such an anneal can also be used to serve another purpose. Most preferred anneals for PSG are probably also adequate to produce activation of ion implanted dopants. If not, they can easily be modified to be adequate. To simplify and reduce cost of processing, we prefer not to have separate heatings to activate the various implants, unless it is necessary. The PSG anneal be considered as a substitute for activation heating.

At the least, it should be recognized as adding heating to chip 10', that can influence the amount of heating needed to get activation, and can contribute to undesired dopant diffusion.

After the PSG 46 is densified, its upper surface is masked with a blanket layer of photoresist (not shown). The photoresist is photolithographically delineated to open a window in it over a central portion of N+ "source" region 38. In this invention, the actual position of the window is not as critical as the masking positioning for the FIG. 1 device. This mask is frequently referred to as a contact mask, because it is used to open up a corresponding contact window in the PSG 46 over a silicon area that is to be contacted by the subsequently applied metallization.

After the contact window in the photoresist is opened over the center of the N+ "source" region 38, an underlying portion of the PSG is exposed within the window. The PSG exposed in the photoresist window, is etched away, through its thickness as by wet or dry chemical etching. Any of the usual etchants can be used as well as the underlying silicon oxide layer 22 that covers the surface of N+ "source" region 38. It can be etched, for example, in an aqueous solution of hydrofluoric acid. For a total PSG and oxide thickness of about 10,000 Å, an etching time of about 6 minutes at a temperature of about 30° C. could be used. On the other hand any of the normal and accepted techniques for oxide etching can be used to remove the PSG 46 and silicon oxide layer 22 exposed within the contact window. It is important however, that this etchant be selective for silicon oxide. In other words, the etchant should etch silicon oxide preferentially, as opposed to monocrystalline silicon.

After the silicon oxide etch, a central portion of the upper surface of the as-formed N+ "source" region disk 38 is exposed. Other contact ares areas exposed as well. The other areas can be covered in a second masking that is not a critical mask. When the second mask is defined, it covers all of the PSG and other contact areas except for the contact area where recess 42 is to be etched. The exposed portion of the N+ "source" region surface in this area is then given an anisotropic plasma etch that preferentially etches silicon. Any of the commercially available preferential anisotropic silicon etches can be used. This forms a silicon trench or recess in the center of the N+ "source" region. The depth of the trench is greater than the thickness of the as-formed N+ "source" region disk, whereby the as-formed N+ "source" region disk becomes an N+ "source" region annulus.

The plasma etching is continued until the trench, or recess, intersects the subsurface disk-like deep P+ ion implanted region that lies below the N+ annular "source" region. This places the bottom 42b of the trench in the subsurface plate-like region 40. This exposes a portion of the subsurface plate-like region at the bottom of the trench. Fundamentally, the trench must be deep enough to penetrate the N+ layer 38, yet shallow enough not to get too close to the bottom of P-well 18'. Otherwise it may adversely affect punch-through voltage of the PN junction of P-well 18' in the area of the recess bottom 42b. Whether punch-through voltage will be adversely affected or not, depends on the level of voltage applied between the anode and cathode when the IGBT is in the "off" condition.

In the FIG. 2 example of this invention, we prefer to have a spacing of at least about 2.0 micrometer between the recess bottom 42b and the bottom of P-well 18'. This spacing will probably yield a punch-through voltage above about 600V. Nonetheless, one may prefer to also use an enhancement implant to insure that a high enough punch-through voltage will result. This is particularly true if one cannot always be sure that the etching of recess 42 will always stop in the middle of the thickness of subsurface P+ region 40, where conductivity is the highest.

The enhancement implant is preferably of the same dopant as used for making P-well 18', which is boron. It could also be of another P-type dopant.

The enhancement ion implant can use the etch mask as an implant mask. Relatively low implant energies of about 10 keV to 60 keV, preferably 40 keV, need be used. A dosage of about $1 \times 10^{14}$ to $1 \times 10^{16}$, preferably about $1 \times 10^{15}$ atoms per square centimeter can be used. The actual preferred dosage will depend on the original doping of the P-well, the distance between the recess bottom 42b and the bottom of the P-well, the thickness of subsurface P+ region 40 in that distance, etc. It should also be noted that it is recognized that the foregoing factors will vary if one experiences difficulties in control of the end point of the etching of recess 42. The recess bottom 42b might end up in a lower conductivity plane of subsurface P+ region 40, or even be below it. In such instance, even if punch-through voltage is not adversely affected, one may wish to use the enhancement implant for another reason. It can be used to reduce resistance between contact 44 and the subsurface P+ region 40.

As with the implants for regions 38 and 40, the enhancement implant is best only activated and not diffused much, if at all. Accordingly, I believe it should only be given an activation anneal, not a higher time and temperature diffusion anneal. For example an anneal at about 900° C. for about 15 minutes can be used. This anneal can easily be provided during PSG densification.

Following the etching of the trench, and the enhancement ion implant (if any), the upper surface of the PSG is given a blanket metallization. As indicated above, the metallization will extend down into the trench. If the trench is narrow enough and the metal is thick enough, the metal can actually fill the trench. A typical metallization layer will have a metal thickness of about 2 micrometers to 5 micrometers, preferably about 4 micrometers. The metal is patterned in the usual manner. For example, a photoresist layer is applied and photolithographically patterned. The blanket metal layer is etched through the patterned photoresist.

It should also be mentioned that a short circumferential flange of cathode 44 may extend laterally on the upper surface of the N+ region 38. This flange may occur incidently due to lateral etching of the PSG as it is being etched vertically, particularly if a wet etching technique is employed. If sufficient contact to N+ region 38 is not acquired in this manner, one can deliberately etch the window in PSG 46 and silicon oxide 22 a little wider with a second oxide etch just before metallization. This will allow a somewhat wider cathode contact on the surface of N+ region 38 to be obtained.

It can be seen that this invention involves activation of the ion implanted boron atoms of region 40 and arsenic atoms of region 38, without causing these atoms to diffuse substantially either the vertically or the horizontally. If it develops that the preferred densification heating does not sufficiently activate either the N+ "source" region 38 or the subsurface P+ region 40, they will have to be activated in a special heat treatment. However, it should be recognized that one does not prefer any significant diffusion to occur in either of layers 38 or 40. Accordingly the temperature and time of any special activation heat treatment should be kept low.

It should be recognized that this invention provides a suppression of the latch-up phenomenon that is inherent to leading conventional IGBT designs. In the method of this invention use is made of a self-aligned moderate energy N+ "source" implant, and a self-aligned high energy P+ ion implant. Combined with a source region trench they significantly suppress the latch-up phenomenon in IGBT devices and provide a process advantage with respect to insulated gate devices generally, but particularly insulated gate bipolar transistors (IGBTs). The self-aligned high energy P+ ion implant adds little increase in complexity and cost of the fabrication process, as is described above. The use of the self-aligned techniques permit other advantages, such as in cell size, current density, breakdown voltage, switching characteristic, and the like. Such techniques permit reduction in the size of the emitter opening for the power device, which provides for improved device performance, and a reduction in individual device size. This means increased cell packing density, which means more power handling per unit area.

Elimination of at least one masking step, compared to most current IGBT processes, allows for smaller device geometries and enhanced yields, which also means lower cost of improved devices. Analogously, the use of the PSG contact mask to etch the silicon trench, gives a double purpose to the contact mask. It should also be mentioned that the self-aligned techniques described here for IGBT devices can also be used to make other insulated gate devices, such as DMOS devices or other MOS power control devices.

It is believed that this invention can be modified in still other ways than disclosed herein consistent with the description hereinbefore set forth. Accordingly, it is to be understood that the protection sought and to be afforded hereby should be deemed to extend to all subject matter defined by the appended claims including all fair equivalents thereof.

The embodiments of the invention in which an exclusive property or privilee is claimed are defined as follows:

1. A semiconductor switching device having multiple PN junctions and an insulated gate control electrode surrounding a power electrode, said switching device comprising:
    a monocrystalline semiconductor substrate portion of one conductivity type providing a base layer;
    a first monocrystalline layer on said base layer, said layer being of an opposite conductivity type of said semiconductive material;
    a second monocrystalline layer on said first layer, said second monocrystalline layer being of said opposite conductivity type semiconductive material and having a given thickness but also having a lesser conductivity than said first monocrystalline layer;
    a first monocrystalline island-like region of said one conductivity type semiconductive material inset in an outer major face of said second monocrystalline layer, said first island-like region having an outer face and also having a thickness less than the thickness of said second monocrystalline layer, whereby said first island-like region has a bottom surface spaced from said first monocrystalline layer;
    a second monocrystalline island-like region of said opposite conductivity type inset wholly within an outer major face of said first island-like region, whereby a circumscribing band of said first island-like region circumferentially surrounds said second island-like region, said second island-like region having an outer face and a thickness less than the thickness of said first island-like region, whereby said second island-like region has a bottom surface spaced from said bottom surface of said first island-like region;
    a subsurface disk-like area of higher doping level in said first island-like region below said second island-like region, said disk-like area having its major faces oriented parallel said island faces and having an outer periphery generally registered with the outer periphery of said second island-like region such that the second island-like region and the disk-like area extend laterally across the first island-like region about the same distance and said subsurface disk-like area being spaced apart from a top surface of said first monocrystalline island-like region;
    a central recess in said outer face of said second island-like region that extends through the thickness of the second island-like region into said subsurface disk-like area of said first island-like region;
    an insulated gate control electrode on at least a circumferential portion of said circumscribing band of said first island-like region, said insulated gate electrode extending completely across said portion of said band;
    a first power electrode in said recess, said electrode being in low electrical resistance contact with said area of higher doping in said first island-like region and also with said second island-like region; and
    a second power electrode in low electrical resistance contact with said substrate base layer.

2. The semiconductor switching device as defined in claim 1 wherein:
    the insulated gate control electrode circumferentially surrounds said second island-like region.

3. The semiconductor switching device as defined in claim 1 wherein:
    the insulated gate control electrode is a layer of polycrystalline silicon on a silicon oxide layer, and
    the polycrystalline silicon layer is about 0.75–1.0 micrometer thick.

4. The semiconductor switching device as defined in claim 1 wherein:
    said central recess has a bottom wall that is located within said subsurface disk-like area of higher doping in said first island-like region.

5. The semiconductor switching device as defined in claim 4 wherein:
    said subsurface area of higher doping in said first island-like region has a higher level of doping under said bottom wall than in other parts of said subsurface disk-like area.

6. The semiconductor switching device as defined in claim 1 wherein:
    said switching device is an insulated gate bipolar transistor.

7. The semiconductor switching device as defined in claim 6 wherein:
    said subsurface disk-like area of higher doping level has a central depression under said bottom wall of said recess.

8. The semiconductor switching device as defined in claim 7 wherein:
    said central depression of said disk-like area has a higher doping level than other parts of said higher level disk-like area of doping in said first island-like area.

9. The semiconductor switching device as defined in claim 1 wherein:
    the base layer and the first island-like region are of P-type conductivity,
    the monocrystalline layers and the second island-like region are of N-type conductivity.

10. The semiconductor switching device as defined in claim 9 wherein:

said N-type monocrystalline layers are epitaxial layers.

11. The semiconductor switching device as defined in claim 9 wherein:

the switching device is an insulated gate bipolar transistor, and said N-type monocrystalline layers are drift layers.

12. An insulated gate bipolar transistor having reduced pinch resistance and a corresponding suppression of parasitic thyristor action, said insulated gate bipolar transistor comprising:

a monocrystalline semiconductor substrate portion of one conductivity type and having a face;

a first epitaxial layer of opposite conductivity type semiconductive material on said face;

a second epitaxial layer of opposite conductivity type on said first epitaxial layer, said second epitaxial layer having a lesser conductivity than said first epitaxial layer and a given thickness;

a first island-like region of said one conductivity type inset in an outer major surface of said second epitaxial layer, said first island-like region having a thickness less than the thickness of said second epitaxial layer, whereby said first island-like region has a bottom surface spaced from said second epitaxial layer;

a second island-like region of said opposite conductivity type inset in an outer major surface of said first island-like region, said second island-like region being generally annular in a plane parallel to said outer major surface and also being disposed wholly within a circumscribing surface band of said first island-like region, said second island-like region having a thickness less than the thickness of said first island-like region, whereby said second island-like region has a bottom surface spaced from said bottom surface of said first island-like region; and an insulated gate electrode on at least a part of said circumscribing surface band of said first island-like region, said insulated gate electrode extending completely across said part of said band;

a generally planar interior portion of said first island-like region that is of higher electrical conductivity than other portions of said first island-like region, said higher conductivity interior portion occupying planes substantially parallel to said outer major surface at a depth at least as deep as the bottom of said second island-like region but not as deep as the bottom of said first island-like region;

an outer periphery of said generally planar interior portion extending under outer parts of said second island like region and in general register with an outer periphery thereof when viewed from said major surface such that the second island-like region and the interior portion extend laterally across the first island-like region about the same distance and said interior portion being spaced apart from a top surface of said first island-like region;

a central part of said generally planar interior portion disposed under a recess in said outer major surface that extends down from said major surface to said central part of said higher conductivity interior portion;

a first power electrode disposed at least in said recess, said electrode being in low electrical resistance contact with both said second part of said higher conductivity interior portion and said second island like region;

a second power electrode in low electrical resistance contact with said substrate portion; and an insulated gate control electrode on said major surface over said circumscribing band of said first island-like region.

13. The semiconductor switching device as defined in claim 12 wherein:

said higher conductivity portion of said first island-like region has a circular periphery that is generally coaxial with, and approximately the same diameter as, the outer periphery of said second island-like region; and said first power electrode has a generally circumferential flange-like lateral extension contacting an outer surface of said second island-like region, said extension being laterally spaced from said insulated gate electrode, effective to permit reduced lateral dimensions of said first and second island-like regions, reduce on-resistance losses, afford reduced tendency for PN junction latch up, and reduce manufacturing costs.

14. The semiconductor switching device as defined in claim 13 wherein:

the one conductivity type is n-type;

the opposite conductivity type is p-type; and the higher conductivity interior portion of said first island-like region is ion implanted.

* * * * *